US011705365B2

(12) United States Patent
Lei et al.

(10) Patent No.: US 11,705,365 B2
(45) Date of Patent: Jul. 18, 2023

(54) METHODS OF MICRO-VIA FORMATION FOR ADVANCED PACKAGING

(71) Applicant: Applied Materials, Inc., Santa Clara, CA (US)

(72) Inventors: Wei-Sheng Lei, San Jose, CA (US); Kurtis Leschkies, San Jose, CA (US); Roman Gouk, San Jose, CA (US); Giback Park, San Jose, CA (US); Kyuil Cho, Santa Clara, CA (US); Tapash Chakraborty, Maharashtra (IN); Han-Wen Chen, Cupertino, CA (US); Steven Verhaverbeke, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/323,381

(22) Filed: May 18, 2021

(65) Prior Publication Data
US 2022/0375787 A1 Nov. 24, 2022

(51) Int. Cl.
*H01L 21/768* (2006.01)
*H01L 21/48* (2006.01)

(52) U.S. Cl.
CPC ...... *H01L 21/76825* (2013.01); *H01L 21/486* (2013.01); *H01L 21/76877* (2013.01)

(58) Field of Classification Search
CPC ... H01L 21/308–3088; H01L 21/31144; H01L 21/32; H01L 21/32139; H01L 21/467; H01L 21/475; H01L 21/469–47576; H01L 21/027–0338
See application file for complete search history.

(56) References Cited

U.S. PATENT DOCUMENTS

| | | | | |
|---|---|---|---|---|
| 4,053,351 A | * | 10/1977 | DeForest | ......... H01L 21/31111 |
| | | | | 216/99 |
| 4,073,610 A | | 2/1978 | Cox | |
| 5,126,016 A | | 6/1992 | Glenning et al. | |
| 5,254,202 A | * | 10/1993 | Kaplan | .................... G03F 1/80 |
| | | | | 359/589 |
| 5,268,194 A | | 12/1993 | Kawakami et al. | |

(Continued)

FOREIGN PATENT DOCUMENTS

| | | |
|---|---|---|
| CA | 2481616 C | 1/2013 |
| CN | 1971894 A | 5/2007 |

(Continued)

OTHER PUBLICATIONS

Chen et al. "Single-Pulse and Pulse-Train Effects in Ultrafast-Laser Micromachining of Fused Silica", Conference on Lasers and Electro-Optics 1999, May 28, 1999 (Year: 1999).*

(Continued)

*Primary Examiner* — Selim U Ahmed
*Assistant Examiner* — Evan G Clinton
(74) *Attorney, Agent, or Firm* — Patterson + Sheridan, LLP (57) ABSTRACT

The present disclosure relates to micro-via structures for interconnects in advanced wafer level semiconductor packaging. The methods described herein enable the formation of high-quality, low-aspect-ratio micro-via structures with improved uniformity, thus facilitating thin and small-form-factor semiconductor devices having high I/O density with improved bandwidth and power.

14 Claims, 8 Drawing Sheets

(56) References Cited

U.S. PATENT DOCUMENTS

| | | | |
|---|---|---|---|
| 5,313,043 A * | 5/1994 | Yamagishi | G02B 27/09 |
| | | | 219/121.84 |
| 5,353,195 A | 10/1994 | Fillion et al. | |
| 5,367,143 A | 11/1994 | White, Jr. | |
| 5,374,788 A | 12/1994 | Endoh et al. | |
| 5,474,834 A | 12/1995 | Tanahashi et al. | |
| 5,670,262 A | 9/1997 | Dalman | |
| 5,767,480 A | 6/1998 | Anglin et al. | |
| 5,783,870 A | 7/1998 | Mostafazadeh et al. | |
| 5,841,102 A | 11/1998 | Noddin | |
| 5,878,485 A | 3/1999 | Wood et al. | |
| 6,010,768 A * | 1/2000 | Yasue | H05K 3/4661 |
| | | | 428/209 |
| 6,039,889 A | 3/2000 | Zhang et al. | |
| 6,087,719 A | 7/2000 | Tsunashima | |
| 6,117,704 A | 9/2000 | Yamaguchi et al. | |
| 6,211,485 B1 | 4/2001 | Burgess | |
| 6,384,473 B1 | 5/2002 | Peterson et al. | |
| 6,388,202 B1 | 5/2002 | Swirbel et al. | |
| 6,388,207 B1 | 5/2002 | Figueroa et al. | |
| 6,459,046 B1 | 10/2002 | Ochi et al. | |
| 6,465,084 B1 | 10/2002 | Curcio et al. | |
| 6,489,670 B1 | 12/2002 | Peterson et al. | |
| 6,495,895 B1 | 12/2002 | Peterson et al. | |
| 6,506,632 B1 | 1/2003 | Cheng et al. | |
| 6,512,182 B2 | 1/2003 | Takeuchi et al. | |
| 6,538,312 B1 | 3/2003 | Peterson et al. | |
| 6,555,906 B2 | 4/2003 | Towle et al. | |
| 6,576,869 B1 | 6/2003 | Gower et al. | |
| 6,593,240 B1 | 7/2003 | Page | |
| 6,631,558 B2 | 10/2003 | Burgess | |
| 6,661,084 B1 | 12/2003 | Peterson et al. | |
| 6,713,719 B1 | 3/2004 | De Steur et al. | |
| 6,724,638 B1 | 4/2004 | Inagaki et al. | |
| 6,775,907 B1 | 8/2004 | Boyko et al. | |
| 6,781,093 B2 | 8/2004 | Conlon et al. | |
| 6,799,369 B2 | 10/2004 | Ochi et al. | |
| 6,894,399 B2 | 5/2005 | Vu et al. | |
| 7,028,400 B1 | 4/2006 | Hiner et al. | |
| 7,062,845 B2 | 6/2006 | Burgess | |
| 7,064,069 B2 | 6/2006 | Draney et al. | |
| 7,078,788 B2 | 7/2006 | Vu et al. | |
| 7,091,589 B2 | 8/2006 | Mori et al. | |
| 7,091,593 B2 | 8/2006 | Ishimaru et al. | |
| 7,105,931 B2 | 9/2006 | Attarwala | |
| 7,129,117 B2 | 10/2006 | Hsu | |
| 7,166,914 B2 | 1/2007 | DiStefano et al. | |
| 7,170,152 B2 | 1/2007 | Huang et al. | |
| 7,192,807 B1 | 3/2007 | Huemoeller et al. | |
| 7,211,899 B2 | 5/2007 | Taniguchi et al. | |
| 7,271,012 B2 | 9/2007 | Anderson | |
| 7,274,099 B2 | 9/2007 | Hsu | |
| 7,276,446 B2 | 10/2007 | Robinson et al. | |
| 7,279,357 B2 | 10/2007 | Shimoishizaka et al. | |
| 7,312,405 B2 | 12/2007 | Hsu | |
| 7,321,164 B2 | 1/2008 | Hsu | |
| 7,449,363 B2 | 11/2008 | Hsu | |
| 7,458,794 B2 | 12/2008 | Schwaighofer et al. | |
| 7,511,365 B2 | 3/2009 | Wu et al. | |
| 7,690,109 B2 | 4/2010 | Mori et al. | |
| 7,714,431 B1 | 5/2010 | Huemoeller et al. | |
| 7,723,838 B2 | 5/2010 | Takeuchi et al. | |
| 7,754,530 B2 | 7/2010 | Wu et al. | |
| 7,808,799 B2 | 10/2010 | Kawabe et al. | |
| 7,839,649 B2 | 11/2010 | Hsu | |
| 7,843,064 B2 | 11/2010 | Kuo et al. | |
| 7,852,634 B2 | 12/2010 | Sakamoto et al. | |
| 7,855,460 B2 | 12/2010 | Kuwajima | |
| 7,868,464 B2 | 1/2011 | Kawabata et al. | |
| 7,887,712 B2 | 2/2011 | Boyle et al. | |
| 7,914,693 B2 | 3/2011 | Jeong et al. | |
| 7,915,737 B2 | 3/2011 | Nakasato et al. | |
| 7,932,595 B1 | 4/2011 | Huemoeller et al. | |
| 7,932,608 B2 | 4/2011 | Tseng et al. | |
| 7,955,942 B2 | 6/2011 | Pagaila et al. | |
| 7,978,478 B2 | 7/2011 | Inagaki et al. | |
| 7,982,305 B1 | 7/2011 | Railkar et al. | |
| 7,988,446 B2 | 8/2011 | Yeh et al. | |
| 8,069,560 B2 | 12/2011 | Mori et al. | |
| 8,137,497 B2 | 3/2012 | Sunohara et al. | |
| 8,283,778 B2 | 10/2012 | Trezza | |
| 8,314,343 B2 | 11/2012 | Inoue et al. | |
| 8,367,943 B2 | 2/2013 | Wu et al. | |
| 8,384,203 B2 | 2/2013 | Toh et al. | |
| 8,390,125 B2 | 3/2013 | Tseng et al. | |
| 8,426,246 B2 | 4/2013 | Toh et al. | |
| 8,470,708 B2 | 6/2013 | Shih et al. | |
| 8,476,769 B2 | 7/2013 | Chen et al. | |
| 8,518,746 B2 | 8/2013 | Pagaila et al. | |
| 8,536,695 B2 | 9/2013 | Liu et al. | |
| 8,628,383 B2 | 1/2014 | Starling et al. | |
| 8,633,397 B2 | 1/2014 | Jeong et al. | |
| 8,698,293 B2 | 4/2014 | Otremba et al. | |
| 8,704,359 B2 | 4/2014 | Tuominen et al. | |
| 8,710,402 B2 | 4/2014 | Lei et al. | |
| 8,710,649 B1 | 4/2014 | Huemoeller et al. | |
| 8,728,341 B2 | 5/2014 | Ryuzaki et al. | |
| 8,772,087 B2 | 7/2014 | Barth et al. | |
| 8,786,098 B2 | 7/2014 | Wang | |
| 8,877,554 B2 | 11/2014 | Tsai et al. | |
| 8,890,628 B2 | 11/2014 | Nair et al. | |
| 8,907,471 B2 | 12/2014 | Beyne et al. | |
| 8,921,995 B1 | 12/2014 | Railkar et al. | |
| 8,952,544 B2 | 2/2015 | Lin et al. | |
| 8,980,691 B2 | 3/2015 | Lin | |
| 8,990,754 B2 | 3/2015 | Bird et al. | |
| 8,994,185 B2 | 3/2015 | Lin et al. | |
| 8,999,759 B2 | 4/2015 | Chia | |
| 9,059,186 B2 | 6/2015 | Shim et al. | |
| 9,064,936 B2 | 6/2015 | Lin et al. | |
| 9,070,637 B2 | 6/2015 | Yoda et al. | |
| 9,099,313 B2 | 8/2015 | Lee et al. | |
| 9,111,914 B2 | 8/2015 | Lin et al. | |
| 9,142,487 B2 | 9/2015 | Toh et al. | |
| 9,159,678 B2 | 10/2015 | Cheng et al. | |
| 9,161,453 B2 | 10/2015 | Koyanagi | |
| 9,210,809 B2 | 12/2015 | Mallik et al. | |
| 9,224,674 B2 | 12/2015 | Malatkar et al. | |
| 9,275,934 B2 | 3/2016 | Sundaram et al. | |
| 9,318,376 B1 | 4/2016 | Holm et al. | |
| 9,355,881 B2 | 5/2016 | Goller et al. | |
| 9,363,898 B2 | 6/2016 | Tuominen et al. | |
| 9,396,999 B2 | 7/2016 | Yap et al. | |
| 9,406,645 B1 | 8/2016 | Huemoeller et al. | |
| 9,499,397 B2 | 11/2016 | Bowles et al. | |
| 9,530,752 B2 | 12/2016 | Nikitin et al. | |
| 9,554,469 B2 | 1/2017 | Hurwitz et al. | |
| 9,660,037 B1 | 5/2017 | Zechmann et al. | |
| 9,698,104 B2 | 7/2017 | Yap et al. | |
| 9,704,726 B2 | 7/2017 | Toh et al. | |
| 9,735,134 B2 | 8/2017 | Chen | |
| 9,748,167 B1 | 8/2017 | Lin | |
| 9,754,849 B2 | 9/2017 | Huang et al. | |
| 9,837,352 B2 | 12/2017 | Chang et al. | |
| 9,837,484 B2 | 12/2017 | Jung et al. | |
| 9,859,258 B2 | 1/2018 | Chen et al. | |
| 9,875,970 B2 | 1/2018 | Yi et al. | |
| 9,887,103 B2 | 2/2018 | Scanlan et al. | |
| 9,887,167 B1 | 2/2018 | Lee et al. | |
| 9,893,045 B2 | 2/2018 | Pagaila et al. | |
| 9,978,720 B2 | 5/2018 | Theuss et al. | |
| 9,997,444 B2 | 6/2018 | Meyer et al. | |
| 10,014,292 B2 | 7/2018 | Or-Bach et al. | |
| 10,037,975 B2 | 7/2018 | Hsieh et al. | |
| 10,053,359 B2 | 8/2018 | Bowles et al. | |
| 10,090,284 B2 | 10/2018 | Chen et al. | |
| 10,109,588 B2 | 10/2018 | Jeong et al. | |
| 10,128,177 B2 | 11/2018 | Kamgaing et al. | |
| 10,153,219 B2 | 12/2018 | Jeon et al. | |
| 10,163,803 B1 | 12/2018 | Chen et al. | |
| 10,170,386 B2 | 1/2019 | Kang et al. | |
| 10,177,083 B2 | 1/2019 | Kim et al. | |
| 10,211,072 B2 | 2/2019 | Chen et al. | |
| 10,229,827 B2 | 3/2019 | Chen et al. | |

(56) References Cited

U.S. PATENT DOCUMENTS

| | | |
|---|---|---|
| 10,256,180 B2 | 4/2019 | Liu et al. |
| 10,269,773 B1 | 4/2019 | Yu et al. |
| 10,297,518 B2 | 5/2019 | Lin et al. |
| 10,297,586 B2 | 5/2019 | Or-Bach et al. |
| 10,304,765 B2 | 5/2019 | Chen et al. |
| 10,347,585 B2 | 7/2019 | Shin et al. |
| 10,410,971 B2 | 9/2019 | Rae et al. |
| 10,424,530 B1 | 9/2019 | Alur et al. |
| 10,515,912 B2 | 12/2019 | Lim et al. |
| 10,522,483 B2 | 12/2019 | Shuto |
| 10,553,515 B2 | 2/2020 | Chew |
| 10,570,257 B2 | 2/2020 | Sun et al. |
| 10,658,337 B2 | 5/2020 | Yu et al. |
| 2001/0020548 A1 | 9/2001 | Burgess |
| 2001/0030059 A1 | 10/2001 | Sugaya et al. |
| 2002/0036054 A1 | 3/2002 | Nakatani et al. |
| 2002/0048715 A1 | 4/2002 | Walczynski |
| 2002/0070443 A1 | 6/2002 | Mu et al. |
| 2002/0074615 A1 | 6/2002 | Honda |
| 2002/0135058 A1 | 9/2002 | Asahi et al. |
| 2002/0158334 A1 | 10/2002 | Vu et al. |
| 2002/0170891 A1 | 11/2002 | Boyle et al. |
| 2003/0059976 A1 | 3/2003 | Nathan et al. |
| 2003/0221864 A1 | 12/2003 | Bergstedt et al. |
| 2003/0222330 A1 | 12/2003 | Sun et al. |
| 2004/0080040 A1 | 4/2004 | Dotta et al. |
| 2004/0118824 A1 | 6/2004 | Burgess |
| 2004/0134682 A1 | 7/2004 | En et al. |
| 2004/0248412 A1 | 12/2004 | Liu et al. |
| 2005/0012217 A1 | 1/2005 | Mori et al. |
| 2005/0170292 A1 | 8/2005 | Tsai et al. |
| 2006/0014532 A1 | 1/2006 | Seligmann et al. |
| 2006/0073234 A1 | 4/2006 | Williams |
| 2006/0128069 A1 | 6/2006 | Hsu |
| 2006/0145328 A1 | 7/2006 | Hsu |
| 2006/0160332 A1 | 7/2006 | Gu et al. |
| 2006/0270242 A1 | 11/2006 | Verhaverbeke et al. |
| 2006/0283716 A1 | 12/2006 | Hafezi et al. |
| 2007/0035033 A1 | 2/2007 | Ozguz et al. |
| 2007/0042563 A1 | 2/2007 | Wang et al. |
| 2007/0077865 A1 | 4/2007 | Dysard et al. |
| 2007/0111401 A1 | 5/2007 | Kataoka et al. |
| 2007/0130761 A1 | 6/2007 | Kang et al. |
| 2008/0006945 A1 | 1/2008 | Lin et al. |
| 2008/0011852 A1 | 1/2008 | Gu et al. |
| 2008/0090095 A1 | 4/2008 | Nagata et al. |
| 2008/0113283 A1 | 5/2008 | Ghoshal et al. |
| 2008/0119041 A1 | 5/2008 | Magera et al. |
| 2008/0173792 A1 | 7/2008 | Yang et al. |
| 2008/0173999 A1 | 7/2008 | Chung et al. |
| 2008/0296273 A1 | 12/2008 | Lei et al. |
| 2009/0084596 A1 | 4/2009 | Inoue et al. |
| 2009/0243065 A1 | 10/2009 | Sugino et al. |
| 2009/0250823 A1 | 10/2009 | Racz et al. |
| 2009/0278126 A1 | 11/2009 | Yang et al. |
| 2010/0013081 A1 | 1/2010 | Toh et al. |
| 2010/0062287 A1 | 3/2010 | Beresford et al. |
| 2010/0144101 A1 | 6/2010 | Chow et al. |
| 2010/0148305 A1 | 6/2010 | Yun |
| 2010/0160170 A1 | 6/2010 | Horimoto et al. |
| 2010/0248451 A1 | 9/2010 | Pirogovsky et al. |
| 2010/0264538 A1 | 10/2010 | Swinnen et al. |
| 2010/0301023 A1 | 12/2010 | Unrath et al. |
| 2010/0307798 A1 | 12/2010 | Izadian |
| 2011/0062594 A1 | 3/2011 | Maekawa et al. |
| 2011/0097432 A1 | 4/2011 | Yu et al. |
| 2011/0111300 A1 | 5/2011 | DelHagen et al. |
| 2011/0151663 A1 | 6/2011 | Chatterjee et al. |
| 2011/0204505 A1 | 8/2011 | Pagaila et al. |
| 2011/0259631 A1 | 10/2011 | Rumsby |
| 2011/0291293 A1 | 12/2011 | Tuominen et al. |
| 2011/0304024 A1 | 12/2011 | Renna |
| 2011/0316147 A1 | 12/2011 | Shih et al. |
| 2012/0128891 A1 | 5/2012 | Takei et al. |
| 2012/0146209 A1 | 6/2012 | Hu et al. |
| 2012/0164827 A1 | 6/2012 | Rajagopalan et al. |
| 2012/0261805 A1 | 10/2012 | Sundaram et al. |
| 2012/0322234 A1* | 12/2012 | Yalamanchili ..... B23K 26/0624 156/345.32 |
| 2013/0069234 A1* | 3/2013 | Lee .................. H01L 21/32134 257/E23.141 |
| 2013/0074332 A1 | 3/2013 | Suzuki |
| 2013/0105329 A1 | 5/2013 | Matejat et al. |
| 2013/0196501 A1 | 8/2013 | Sulfridge |
| 2013/0203190 A1 | 8/2013 | Reed et al. |
| 2013/0286615 A1 | 10/2013 | Inagaki et al. |
| 2013/0341738 A1 | 12/2013 | Reinmuth et al. |
| 2014/0054075 A1 | 2/2014 | Hu |
| 2014/0092519 A1 | 4/2014 | Yang |
| 2014/0094094 A1 | 4/2014 | Rizzuto et al. |
| 2014/0103499 A1 | 4/2014 | Andry et al. |
| 2014/0252655 A1 | 9/2014 | Tran et al. |
| 2014/0353019 A1 | 12/2014 | Arora et al. |
| 2015/0228416 A1 | 8/2015 | Hurwitz et al. |
| 2015/0296610 A1 | 10/2015 | Daghighian et al. |
| 2015/0311093 A1 | 10/2015 | Li et al. |
| 2015/0359098 A1 | 12/2015 | Ock |
| 2015/0380356 A1 | 12/2015 | Chauhan et al. |
| 2016/0013135 A1 | 1/2016 | He et al. |
| 2016/0020163 A1 | 1/2016 | Shimizu et al. |
| 2016/0049371 A1 | 2/2016 | Lee et al. |
| 2016/0088729 A1 | 3/2016 | Kobuke et al. |
| 2016/0095203 A1 | 3/2016 | Min et al. |
| 2016/0118337 A1 | 4/2016 | Yoon et al. |
| 2016/0270242 A1 | 9/2016 | Kim et al. |
| 2016/0276325 A1 | 9/2016 | Nair et al. |
| 2016/0329299 A1 | 11/2016 | Lin et al. |
| 2016/0336296 A1 | 11/2016 | Jeong et al. |
| 2017/0047308 A1 | 2/2017 | Ho et al. |
| 2017/0064835 A1 | 3/2017 | Ishihara et al. |
| 2017/0223842 A1 | 8/2017 | Chujo et al. |
| 2017/0229432 A1 | 8/2017 | Lin et al. |
| 2017/0338254 A1 | 11/2017 | Reit et al. |
| 2018/0019197 A1 | 1/2018 | Boyapati et al. |
| 2018/0047666 A1 | 2/2018 | Lin et al. |
| 2018/0116057 A1 | 4/2018 | Kajihara et al. |
| 2018/0182727 A1 | 6/2018 | Yu |
| 2018/0197831 A1 | 7/2018 | Kim et al. |
| 2018/0204802 A1 | 7/2018 | Lin et al. |
| 2018/0308792 A1 | 10/2018 | Raghunathan et al. |
| 2018/0352658 A1 | 12/2018 | Yang |
| 2018/0374696 A1 | 12/2018 | Chen et al. |
| 2018/0376589 A1 | 12/2018 | Harazono |
| 2019/0088603 A1 | 3/2019 | Marimuthu et al. |
| 2019/0131224 A1 | 5/2019 | Choi et al. |
| 2019/0131270 A1 | 5/2019 | Lee et al. |
| 2019/0131284 A1 | 5/2019 | Jeng et al. |
| 2019/0189561 A1 | 6/2019 | Rusli |
| 2019/0229046 A1 | 7/2019 | Tsai et al. |
| 2019/0237430 A1 | 8/2019 | England |
| 2019/0285981 A1 | 9/2019 | Cunningham et al. |
| 2019/0306988 A1 | 10/2019 | Grober et al. |
| 2019/0355675 A1 | 11/2019 | Lee et al. |
| 2019/0355680 A1 | 11/2019 | Chuang et al. |
| 2019/0369321 A1 | 12/2019 | Young et al. |
| 2020/0003936 A1 | 1/2020 | Fu et al. |
| 2020/0009688 A1* | 1/2020 | Chai ................... B23K 26/142 |
| 2020/0039002 A1 | 2/2020 | Sercel et al. |
| 2020/0130131 A1 | 4/2020 | Togawa et al. |
| 2020/0294791 A1* | 9/2020 | Okita ..................... H01L 21/78 |
| 2020/0357947 A1 | 11/2020 | Chen et al. |
| 2020/0358163 A1 | 11/2020 | See et al. |

FOREIGN PATENT DOCUMENTS

| | | |
|---|---|---|
| CN | 100463128 C | 2/2009 |
| CN | 100502040 C | 6/2009 |
| CN | 100524717 C | 8/2009 |
| CN | 100561696 C | 11/2009 |
| CN | 104637912 A | 5/2015 |
| CN | 105436718 A | 3/2016 |
| CN | 106531647 A | 3/2017 |
| CN | 106653703 A | 5/2017 |
| CN | 108028225 A | 5/2018 |

(56) References Cited

FOREIGN PATENT DOCUMENTS

| | | | |
|---|---|---|---|
| CN | 111492472 A | 8/2020 | |
| CN | 108472862 B * | 10/2020 | ......... B29C 35/0266 |
| EP | 0264134 A2 | 4/1988 | |
| EP | 1536673 A1 | 6/2005 | |
| EP | 1478021 B1 | 7/2008 | |
| EP | 2023382 A1 | 2/2009 | |
| EP | 1845762 B1 | 5/2011 | |
| EP | 2942808 A1 | 11/2015 | |
| JP | 2001244591 A | 9/2001 | |
| JP | 2002246755 A | 8/2002 | |
| JP | 2003188340 A | 7/2003 | |
| JP | 2004311788 A | 11/2004 | |
| JP | 2004335641 A | 11/2004 | |
| JP | 4108285 B2 | 6/2008 | |
| JP | 2012069926 A | 4/2012 | |
| JP | 5004378 B2 | 8/2012 | |
| JP | 5111342 B2 | 1/2013 | |
| JP | 5693977 B2 | 4/2015 | |
| JP | 5700241 B2 | 4/2015 | |
| JP | 5981232 B2 | 8/2016 | |
| JP | 6394136 B2 | 9/2018 | |
| JP | 6542616 B2 | 7/2019 | |
| JP | 6626697 B2 | 12/2019 | |
| KR | 100714196 B1 | 5/2007 | |
| KR | 100731112 B1 | 6/2007 | |
| KR | 10-2008-0037296 A | 4/2008 | |
| KR | 2008052491 A | 6/2008 | |
| KR | 20100097893 A | 9/2010 | |
| KR | 101301507 B1 | 9/2013 | |
| KR | 20140086375 A | 7/2014 | |
| KR | 101494413 B1 | 2/2015 | |
| KR | 20160013706 A | 2/2016 | |
| KR | 20180113885 A | 10/2018 | |
| KR | 101922884 B1 | 11/2018 | |
| KR | 101975302 B1 | 8/2019 | |
| KR | 102012443 B1 | 8/2019 | |
| TW | I594397 B | 8/2017 | |
| WO | 2011130300 A1 | 10/2011 | |
| WO | 2013008415 A1 | 1/2013 | |
| WO | 2013126927 A2 | 8/2013 | |
| WO | 2015126438 A1 | 8/2015 | |
| WO | 2017111957 A1 | 6/2017 | |
| WO | 2018013122 A1 | 1/2018 | |
| WO | 2018125184 A1 | 7/2018 | |
| WO | 2019023213 A1 | 1/2019 | |
| WO | 2019066988 A1 | 4/2019 | |
| WO | 2019/177742 A1 | 9/2019 | |
| WO | WO-2022039062 A1 * | 2/2022 | |

OTHER PUBLICATIONS

Schaffer et al., Micromachining Bulk Glass by Use of Femtosecond Laser Pulses with Nanojoule Energy:, Optics Letters, vol. 26, Issue 2, pp. 93-95, 2001 (Year: 2001).*
Allresist Gmbh—Strausberg et al: "Resist-Wiki: Adhesion promoter HMDS and diphenylsilanedio (AR 300-80) -. . . -ALLRESIST GmbH—Strausberg, Germany", Apr. 12, 2019 (Apr. 12, 2019), XP055663206, Retrieved from the Internet URL:https://web.archive.org/web/20190412 20micals-adhesion-promoter-hmds-and-diphenyl2908/https://www.allresist.com/process-chemicals-adhesion-promoter-hmds-and-diphenylsilanedio/, [retrieved on Jan. 29, 2020].
Amit Kelkar, et al. "Novel Mold-free Fan-out Wafer Level Package using Silicon Wafer", IMAPS 2016—49th International Symposium on Microelectronics—Pasadena, CA USA—Oct. 10-13, 2016, 5 pages. (IMAPS 2016—49th International Symposium on Microelectronics—Pasadena, CA USA—Oct. 10-13, 2016, 5 pages.).
Arifur Rahman. "System-Level Performance Evaluation of Three-Dimensional Integrated Circuits", vol. 8, No. 6, Dec. 2000. pp. 671-678.
Baier, T. et al., Theoretical Approach to Estimate Laser Process Parameters for Drilling in Crystalline Silicon, Prog. Photovolt: Res. Appl. 18 (2010) 603-606, 5 pages.
Chen, Qiao—"Modeling, Design and Demonstration of Through-Package-Vias in Panel-Based Polycrystalline Silicon Interposers for High Performance, High Reliability and Low Cost," a Dissertation presented to the Academic Faculty, Georgia Institute of Technology, May 2015, 168 pages.
Chien-Wei Chien et al. "Chip Embedded Wafer Level Packaging Technology for Stacked RF-SiP Application",2007 IEEE, pp. 305-310.
Chien-Wei Chien et al. "3D Chip Stack With Wafer Through Hole Technology". 6 pages.
Doany, F.E., et al.—"Laser release process to obtain freestanding multilayer metal-poly imide circuits," IBM Journal of Research and Development, vol. 41, Issue 1/2, Jan./Mar. 1997, pp. 151-157.
Dyer, P.E., et al.—"Nanosecond photoacoustic studies on ultraviolet laser ablation of organic polymers," Applied Physics Letters, vol. 48, No. 6, Feb. 10, 1986, pp. 445-447.
Han et al.—"Process Feasibility and Reliability Performance of Fine Pitch Si Bare Chip Embedded in Through Cavity of Substrate Core," IEEE Trans. Components, Packaging and Manuf. Tech., vol. 5, No. 4, pp. 551-561, 2015. [Han et al. IEEE Trans. Components, Packaging and Manuf. Tech., vol. 5, No. 4, pp. 551-561, 2015.].
Han et al.—"Through Cavity Core Device Embedded Substrate for Ultra-Fine-Pitch Si Bare Chips; (Fabrication feasibility and residual stress evaluation)", ICEP-IAAC, 2015, pp. 174-179. [Han et al., ICEP-IAAC, 2015, pp. 174-179 ].
Han, Younggun, et al.—"Evaluation of Residual Stress and Warpage of Device Embedded Substrates with Piezo-Resistive Sensor Silicon Chips" technical paper, Jul. 31, 2015, pp. 81-94.
International Search Report and the Written Opinion for International Application No. PCT/US2019/064280 dated Mar. 20, 2020, 12 pages.
International Search Report and Written Opinion for Application No. PCT/US2020/026832 dated Jul. 23, 2020.
Italian search report and written opinion for Application No. IT 201900006736 dated Mar. 2, 2020.
Italian Search Report and Written Opinion for Application No. IT 201900006740 dated Mar. 4, 2020.
Junghoon Yeom', et al. "Critical Aspect Ratio Dependence in Deep Reactive Ion Etching of Silicon", 2003 IEEE. pp. 1631-1634.
K. Sakuma et al. "3D Stacking Technology with Low-Volume Lead-Free Interconnections", IBM T.J. Watson Research Center. 2007 IEEE, pp. 627-632.
Kenji Takahashi et al. "Current Status of Research and Development for Three-Dimensional Chip Stack Technology", Jpn. J. Appl. Phys. Vol. 40 (2001) pp. 3032-3037, Part 1, No. 4B, Apr. 2001. 6 pages.
Kim et al. "A Study on the Adhesion Properties of Reactive Sputtered Molybdenum Thin Films with Nitrogen Gas on Polyimide Substrate as a Cu Barrier Layer," 2015, Journal of Nanoscience and Nanotechnology, vol. 15, No. 11, pp. 8743-8748, doi: 10.1166/jnn.2015.11493.
Knickerbocker, J.U., et al.—"Development of next-generation system-on-package (SOP) technology based on silicon carriers with fine-pitch chip interconnection," IBM Journal of Research and Development, vol. 49, Issue 4/5, Jul./Sep. 2005, pp. 725-753.
Knickerbocker, John U., et al.—"3-D Silicon Integration and Silicon Packaging Technology Using Silicon Through-Vias," IEEE Journal of Solid-State Circuits, vol. 41, No. 8, Aug. 2006, pp. 1718-1725.
Knorz, A. et al., High Speed Laser Drilling: Parameter Evaluation and Characterisation, Presented at the 25th European PV Solar Energy Conference and Exhibition, Sep. 6-10, 2010, Valencia, Spain, 7 pages.
L. Wang, et al. "High aspect ratio through-wafer interconnections for 3Dmicrosystems", 2003 IEEE. pp. 634-637.
Lannon, John Jr., et al.—"Fabrication and Testing of a TSV-Enabled Si Interposer with Cu- and Polymer-Based Multilevel Metallization," IEEE Transactions on Components, Packaging and Manufacturing Technology, vol. 4, No. 1, Jan. 2014, pp. 153-157.
Lee et al. "Effect of sputtering parameters on the adhesion force of copper/molybdenum metal on polymer substrate," 2011, Current Applied Physics, vol. 11, pp. S12-S15, doi: 10.1016/j.cap.2011.06.019.

(56) References Cited

OTHER PUBLICATIONS

Liu, C.Y. et al., Time Resolved Shadowgraph Images of Silicon during Laser Ablation: Shockwaves and Particle Generation, Journal of Physics: Conference Series 59 (2007) 338-342, 6 pages.
Malta, D., et al.—"Fabrication of TSV-Based Silicon Interposers," 3D Systems Integration Conference (3DIC), 2010 EEE International, Nov. 16-18, 2010, 6 pages.
Narayan, C., et al.—"Thin Film Transfer Process for Low Cost MCM's," Proceedings of 1993 IEEE/CHMT International Electronic Manufacturing Technology Symposium, Oct. 4-6, 1993, pp. 373-380.
NT Nguyen et al. "Through-Wafer Copper Electroplating for Three-Dimensional Interconnects", Journal of Micromechanics and Microengineering. 12 (2002) 395-399. 2002 IOP.
PCT International Search Report and Written Opinion dated Aug. 28, 2020, for International Application No. PCT/US2020/032245.
PCT International Search Report and Written Opinion dated Feb. 17, 2021 for International Application No. PCT/US2020/057787.
PCT International Search Report and Written Opinion dated Feb. 19, 2021, for International Application No. PCT/US2020/057788.
PCT International Search Report and Written Opinion dated Sep. 15, 2020, for International Application No. PCT/US2020/035778.
Ronald Hon et al. "Multi-Stack Flip Chip 3D Packaging with Copper Plated Through-Silicon Vertical Interconnection", 2005 IEEE pp. 384-389.
S. W. Ricky Lee et al. "3D Stacked Flip Chip Packaging with Through Silicon Vias and Copper Plating or Conductive Adhesive Filling", 2005 IEEE, pp. 798-801.
Shen, Li-Cheng, et al.—"A Clamped Through Silicon Via (TSV) Interconnection for Stacked Chip Bonding Using Metal Cap on Pad and Metal col. Forming in Via," Proceedings of 2008 Electronic Components and Technology Conference, pp. 544-549.
Shi, Tailong, et al.—"First Demonstration of Panel Glass Fan-out (GFO) Packages for High I/O Density and High Frequency Multi-chip Integration," Proceedings of 2017 IEEE 67th Electronic Components and Technology Conference, May 30-Jun. 2, 2017, pp. 41-46.
Srinivasan, R., et al.—"Ultraviolet Laser Ablation of Organic Polymers," Chemical Reviews, 1989, vol. 89, No. 6, pp. 1303-1316.
Taiwan Office Action dated Oct. 27, 2020 for Application No. 108148588.
Trusheim, D. et al., Investigation of the Influence of Pulse Duration in Laser Processes for Solar Cells, Physics Procedia Dec. 2011, 278-285, 9 pages.
U.S. Office Action dated May 13, 2021, in U.S. Appl. No. 16/870,843.
Wu et al., Microelect. Eng., vol. 87 2010, pp. 505-509.
Yu et al. "High Performance, High Density RDL for Advanced Packaging," 2018 IEEE 68th Electronic Components and Technology Conference, pp. 587-593, DOI 10.1109/ETCC.2018.0009.
Yu, Daquan—"Embedded Silicon Fan-out (eSiFO) Technology for Wafer-Level System Integration," Advances in Embedded and Fan-Out Wafer-Level Packaging Technologies, First Edition, edited by Beth Keser and Steffen Kroehnert, published 2019 by John Wiley & Sons, Inc., pp. 169-184.
Tecnisco, Ltd.—"Company Profile" presentation with product introduction, date unknown, 26 pages.
Wang et al. "Study of Direct Cu Electrodeposition on Ultra-Thin Mo for Copper Interconnect", State key lab of ASIC and system, School of microelectronics, Fudan University, Shanghai, China; 36 pages.
International Search Report and Written Opinion dated Oct. 7, 2021 for Application No. PCT/US2021037375.
PCT International Search Report and Written Opinion dated Oct. 19, 2021, for International Application No. PCT/US2021/038690.
PCT International Search Report and Written Opinion dated Feb. 4, 2022, for International Application No. PCT/US2021/053830.
PCT International Search Report and Written Opinion dated Feb. 4, 2022, for International Application No. PCT/US2021/053821.
PCT International Search Report and Written Opinion dated Aug. 12, 2022 for International Application No. PCT/US2022/026652.

\* cited by examiner

METHODS OF MICRO-VIA FORMATION FOR ADVANCED PACKAGING

BACKGROUND

Field

Embodiments described herein generally relate to micro-via structures for advanced wafer level semiconductor packaging and methods of forming the same.

Description of the Related Art

Along with other ongoing trends in the development of miniaturized electronic devices and components, the demand for faster processing capabilities with greater circuit densities imposes corresponding demands on the materials, structures, and processes utilized in the fabrication of integrated circuit chips, circuit boards, and package structures. Accordingly, one area of focus in semiconductor device development is the structure and fabrication methods of device interconnections (i.e., interconnects or interconnect structures) with reduced lateral dimensions.

As is known, a vertical interconnect access (or "via") is one example of an interconnect structure, and laser drilling is an established method for forming vias. Despite the trend toward smaller vias for higher interconnect density, conventional approaches for forming vias with such small diameters, e.g., diameters approaching 10 µm or less, particularly in a high-volume manufacturing setting, may sacrifice certain quality parameters of the vias in order to obtain desired dimensions. Examples of such quality parameters generally include via morphology, uniformity, and via pad cleanliness.

Additionally, current approaches for laser drilling vias typically rely on ultraviolet (UV) laser or pulsed $CO_2$ lasers to directly drill the vias in panels. Both of these approaches require complex beam shaping optics to convert Gaussian laser beam profiles emitted by the laser sources into top-hat (i.e., flat top) shaped beam profiles, and such top-hot shaped beam profiles are typically not capable of drilling diameters less than 40 µm in a consistent and cost-effective manner. Thus, masks may be used in combination with laser drilling in order to achieve a desired via size. However, current masking techniques require wet etching and/or laser drilling for mask patterning, which may cause damage to any underlying layers and/or formation of unwanted debris. Further, certain approaches utilize masks formed of substantially the same material as underlying conductive layers and/or interconnects, thus making it difficult to remove the mask upon laser drilling of vias.

Therefore, there is a need in the art for improved methods of forming high-quality, small-diameter vias, e.g., micro-vias.

SUMMARY

The present disclosure generally relates to micro-via structures for advanced wafer level semiconductor packaging and methods of forming the same.

In certain embodiments, a method of forming a micro-via structure in a semiconductor device is provided. The method includes laminating a dielectric layer over the semiconductor device, depositing a metal layer over the dielectric layer, and applying, patterning, and developing a resist over the metal layer to form a trench in the resist layer corresponding to a desired lateral dimension of the micro-via structure. The method further includes etching the metal layer through the trench in the developed resist layer to extend the trench into the metal layer and expose a portion of the dielectric layer. The method also includes laser ablating the exposed portion of the dielectric layer to form the micro-via structure therein having the desired lateral dimension.

In certain embodiments, a method of forming a micro-via structure in a semiconductor device is provided. The method includes laminating a dielectric layer over a conductive layer of the semiconductor device, depositing a metal layer over the dielectric layer, and applying, patterning, and developing a resist over the metal layer to form a trench in the resist layer corresponding to a desired lateral dimension of the micro-via structure. The method further includes selectively etching the metal layer through the trench in the developed resist layer to extend the trench into the metal layer and expose a portion of the dielectric layer, laser ablating the exposed portion of the dielectric layer to form the micro-via structure therein having the desired lateral dimension, exposing the micro-via structure to a cleaning process to remove debris therefrom, and selectively removing the metal layer from the dielectric layer.

In certain embodiments, a method of forming a micro-via structure in a semiconductor device is provided. The method includes laminating a dielectric layer over a conductive layer of the semiconductor device, depositing a chromium layer over the dielectric layer, and applying, patterning, and developing a resist over the chromium layer to form a trench in the resist layer corresponding to a desired lateral dimension of the micro-via structure. The method further includes selectively etching the chromium layer through the trench in the developed resist layer to extend the trench into the chromium layer and expose a portion of the dielectric layer, laser ablating the exposed portion of the dielectric layer to form the micro-via structure therein having the desired lateral dimension, wherein the conductive layer of the semiconductor device is utilized as a laser stop. The method further includes removing the resist from the chromium layer, exposing the micro-via structure to a cleaning process to remove debris therefrom, and selectively removing the metal layer from the dielectric layer with a wet etch process. The cleaning process includes a dry fluorine-based plasma etch and a methanol-based wet clean.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the present disclosure relate to micro-via structures for advanced wafer level semiconductor packaging and methods of forming the same. The ongoing demands for miniaturized package structures with greater densities drive a need for corresponding small-sized interconnects, e.g., vias. However, as circuit densities are being increased and via dimensions decreased, via formation methods become increasingly difficult, largely due to limitations associated with quality and uniformity of laser-drilling narrow via structures. As a result, low quality and non-uniform vias are formed, which may result in reduced performance. The methods described herein provide for improved methods of forming high quality and uniform micro-via structures.

Figure 1:
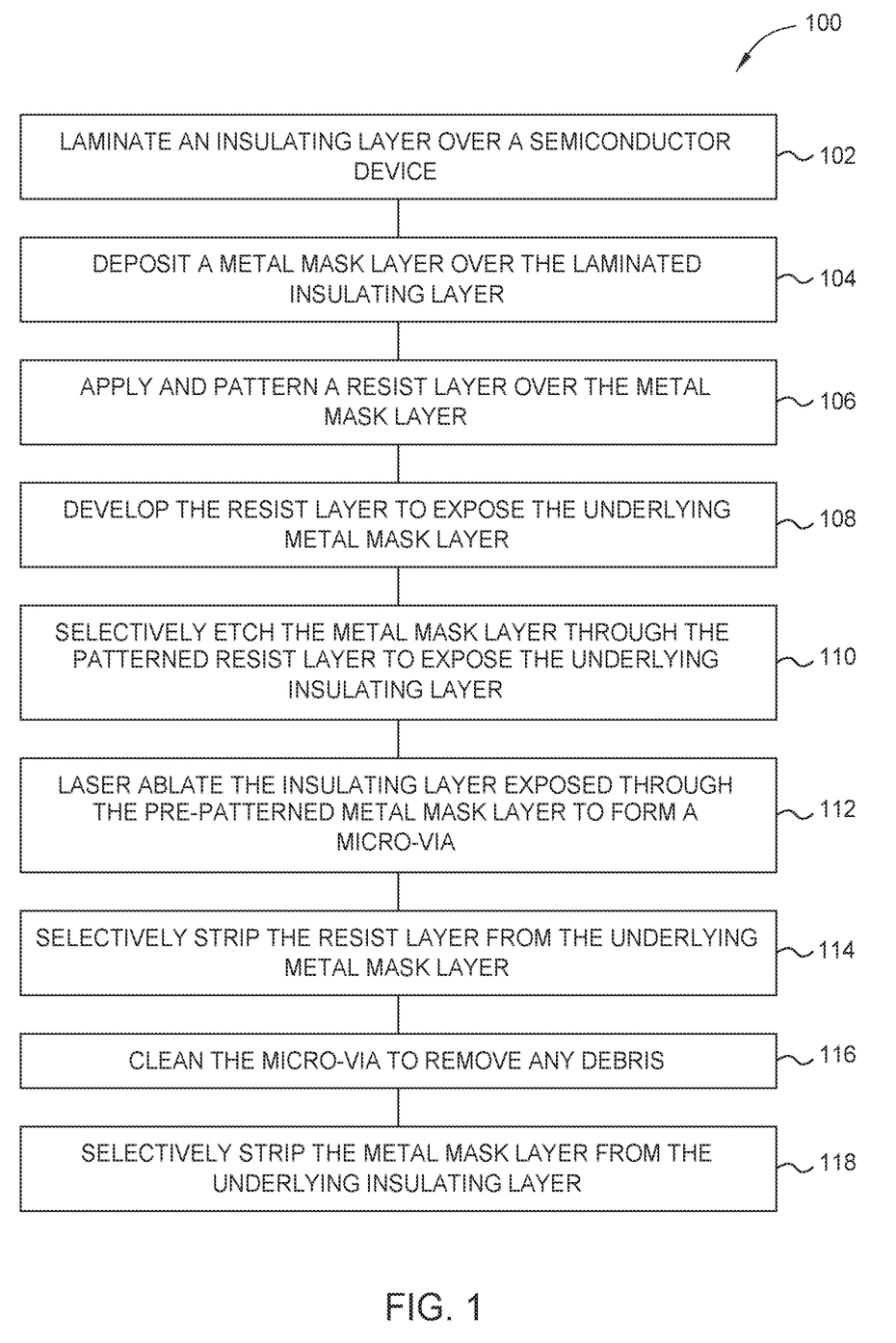
FIG. 1 illustrates a flow diagram of a process for forming a micro-via in a semiconductor device, according to embodiments described herein.

FIG. 1 illustrates a flow diagram of a representative method 100 for forming a micro-via in a semiconductor device, such as in a redistribution layer (RDL) of a semiconductor package, according to certain embodiments of the present disclosure. FIGS. 2A-2J schematically illustrate cross-sectional views of a portion of a semiconductor device 200 at different stages of the method 100 represented in FIG. 1. Accordingly, FIG. 1 and FIGS. 2A-2J are herein described together for clarity. Note that although described in relation to the formation of a single micro-via, the methods disclosed herein may be utilized to form a plurality or array of micro-vias in a semiconductor device simultaneously or in sequence.

Figure 2A:
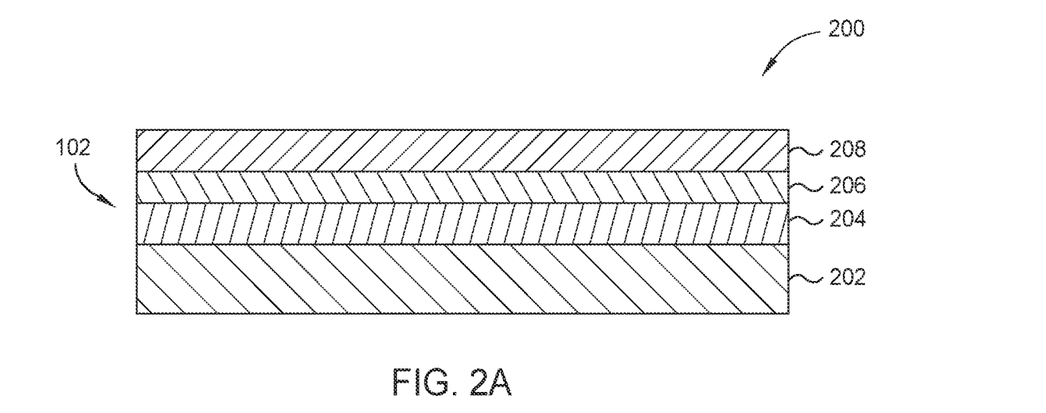
FIGS. 2A-2J schematically illustrate cross-sectional views of a portion of a semiconductor device at different stages of the process depicted in FIG. 1, according to embodiments described herein.

Generally, method 100 begins at operation 102, corresponding to FIG. 2A, wherein an insulating layer 208 is laminated over the semiconductor device 200. As described above, in FIGS. 2A-2J, only a portion of semiconductor device 200 is shown, and the insulating layer 208 may be utilized to form an RDL thereon. The semiconductor device 200 may be any suitable type of semiconductor device, including but not limited to a 3D semiconductor package (e.g., 3D wafer level package (WLP), 3D system-in-package (SiP), stacked integrated circuit (SIC), 3D package-on-package (POP), etc.), 2.5D interposer, 2D semiconductor package, and the like. Accordingly, semiconductor device 200 may include one or more embedded active and/or passive devices (e.g., semiconductor dies, memory dies, capacitors, inductors, RF devices, etc.) (not shown) and one or more conductive interconnects routed therebetween (not shown).

As illustrated in FIG. 2A, the semiconductor device 200 includes a substrate 202, which may function as a frame or core structure for the semiconductor device 200. Generally, the substrate 202 is formed of any suitable substrate material including but not limited to a III-V compound semiconductor material, silicon (e.g., having a resistivity between about 1 and about 10 Ohm-cm or conductivity of about 100 W/mK), crystalline silicon (e.g., Si<100> or Si<111>), silicon oxide ($SiO_2$), silicon germanium (SiGe), doped or undoped silicon, undoped high resistivity silicon (e.g., float zone silicon having lower dissolved oxygen content and a resistivity between about 5000 and about 10000 ohm-cm), doped or undoped polysilicon, silicon nitride ($Si_3N_4$), silicon carbide (SiC) (e.g., having a conductivity of about 500 W/mK), quartz, glass (e.g., borosilicate glass), sapphire or aluminum oxide ($Al_2O_3$), and/or ceramic materials. In certain embodiments, the substrate 202 is a monocrystalline p-type or n-type silicon substrate. In certain embodiments, the substrate 202 is a polycrystalline p-type or n-type silicon substrate. In certain embodiments, the substrate 202 is a p-type or n-type silicon solar substrate.

The substrate 202 may further have any suitable shape and/or dimensions. For example, the substrate 202 may have a polygonal or circular shape. In certain embodiments, the substrate 202 includes a substantially square silicon substrate having lateral dimensions between about 120 mm and about 220 mm, such as about 160 mm or between about 156 mm and about 166 mm, with or without chamfered edges. In certain other embodiments, the substrate 202 includes a circular silicon-containing wafer having a diameter between about 100 mm and about 450 mm, such as between about 150 mm and about 300 mm, for example about 200 mm.

Unless otherwise noted, embodiments and examples described herein are conducted on substrates having a thickness between about 50 µm and about 1500 µm, such as between about 90 µm and about 780 µm. For example, the substrate 202 has a thickness between about 100 µm and about 300 µm, such as a thickness between about 110 µm and about 200 µm. In another example, the substrate 202 has a thickness between about 60 µm and about 180 µm, such as a thickness between about 80 µm and about 120 µm.

In certain embodiments, the semiconductor device 202 further includes an insulating layer 204 formed on the substrate 202. Generally, the insulating layer 204 may be formed of a dielectric and polymeric material, such as an epoxy resin. For example, the insulating layer 204 may be formed of a ceramic-filler-containing epoxy resin, such as an epoxy resin filled with (e.g., containing) substantially spherical silica ($SiO_2$) particles. As used herein, the term "spherical" refers to any round, ellipsoid, or spheroid shape. For example, in certain embodiments, the ceramic fillers may have an elliptic shape, an oblong oval shape, or other similar round shape. However, other morphologies are also contemplated. Other examples of ceramic fillers that may be utilized to form dielectric film 220 include aluminum nitride (AlN), aluminum oxide ($Al_2O_3$), silicon carbide (SiC), silicon nitride ($Si_3N_4$), $Sr_2Ce_2Ti_5O_{16}$ ceramics, zirconium silicate ($ZrSiO_4$), wollastonite ($CaSiO_3$), beryllium oxide (BeO), cerium dioxide ($CeO_2$), boron nitride (BN), calcium copper titanium oxide ($CaCu_3Ti_4O_{12}$), magnesium oxide (MgO), titanium dioxide ($TiO_2$), zinc oxide (ZnO) and the like.

In some examples, the ceramic fillers utilized to form the insulating layer 204 have particles ranging in size between about 40 nm and about 1.5 µm, such as between about 80 nm and about 1 µm. For example, the ceramic fillers utilized to form the insulating layer 204 have particles ranging in size between about 200 nm and about 800 nm, such as between about 300 nm and about 600 nm. In certain embodiments, the ceramic fillers include particles having a size less than about 25% of a width or diameter of a desired structure patterned in the substrate 202, including vias for interconnects and cavities for active and/or passive devices. In certain embodiments, the ceramic fillers have particles having a size less than about 15% of a desired patterned structure's width or diameter.

In still further embodiments, the insulating layer 204 is formed of a polyimide material, such as a photodefinable or non-photosensitive polyimide material, a polybenzoxazole (PBO) material, a silicon dioxide material, and/or a silicon nitride material.

As further illustrated in FIG. 2A, the semiconductor device 202 includes a conductive layer 206 formed over the insulating layer 204. The conductive layer 206 may represent a trace layer, wiring layer, pad layer, or any other type of lateral interconnect structure for electrically coupling one or more active and/or passive devices. In certain embodiments, the conductive layer 206 has a thickness between about 2 μm and about 20 μm, such as between about 3 μm and about 18 μm, such as between about 6 μm and about 18 μm. The conductive layer 206 is generally formed of one or more layers of any suitable conductive material, including but not limited to copper (Cu), aluminum (Al), gold (Au), nickel (Ni), silver (Ag), palladium (Pd), tin (Sn), or the like. In certain embodiments, an adhesion layer (not shown) and/or a seed layer (not shown) are formed between surfaces of the insulating layer 204 and the conductive layer 206 for better adhesion of the conductive layer 206 thereto and to block diffusion of conductive materials. For example, in certain embodiments, a molybdenum (Mo), titanium (Ti), tantalum (Ta), or titanium-tungsten (WTi) adhesion layer and/or a copper seed layer are formed between the insulating layer 204 and the conductive layer 206.

Returning back now to FIG. 1 and method 100, at operation 102, the insulating layer 208 is laminated over the semiconductor device 200. In certain embodiments, the insulating layer 208 is substantially similar to insulating layer 204. For example, in certain embodiments, the insulating layer 208 is formed of a dielectric material, such as a ceramic-filler-containing epoxy resin, a polyimide material, a PBO material, a silicon dioxide material, and/or a silicon nitride material. In certain other embodiments, however, the insulating layer 208 is formed of a different material than insulating layer 204. Generally, the insulating layer 208 has a thickness between about 2 μm and about 20 μm, such as between about 4 μm and about 18 μm, such as between about 6 μm and about 14 μm.

During lamination, insulating layer 208 (e.g., as a film) is placed over the semiconductor device 200 and is thereafter exposed to elevated temperatures, causing the insulating layer 208 to soften and adhere to, e.g., the conductive layer 206, of the semiconductor device 200. In certain embodiments, the lamination operation includes a vacuum lamination process that may be performed in a laminator or other suitable device. In certain embodiments, the lamination operation is performed by use of a hot pressing process.

In certain embodiments, the lamination operation is performed at a temperature of between about 80° C. and about 200° C. and for a period between about 5 seconds and about 90 seconds, such as between about 30 seconds and about 60 seconds. In certain embodiments, the lamination operation includes the application of a pressure of between about 1 psig and about 50 psig while the semiconductor device 200, with insulating layer 208 placed thereon, is exposed to a temperature between about 80° C. and about 140° C. for a period between about 5 seconds and about 90 seconds. For example, the lamination operation is performed at a pressure of between about 5 psig and about 40 psig and a temperature of between about 100° C. and about 120° C. for a period between about 10 seconds and about 1 minute. In some examples, the lamination operation is performed at a temperature of about 110° C. for a period of about 20 seconds.

Figure 2B:
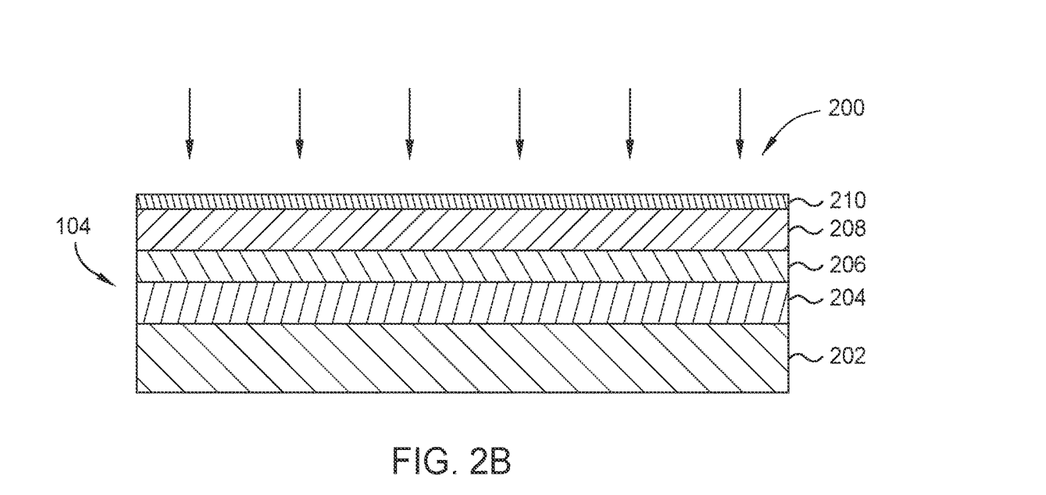

Once the insulating layer 208 is laminated onto the semiconductor device 200, a metal mask layer 210 is deposited over the insulating layer 208 at operation 104, which corresponds to FIG. 2B. The metal mask layer 210 may be formed of one or more suitable metals, including but not limited to chromium (Cr), tungsten (W), molybdenum, copper, and/or the like. In certain embodiments, the metal mask layer 210 is formed of a refractory metal. Generally, the metal mask layer 210 has a thickness between about 50 nm and about 500 nm, such as between about 100 nm and about 400 nm, such as between about 100 nm and about 300 nm. For example, in certain embodiments, the metal mask layer 210 has a thickness of about 200 nm. The metal mask layer 210 may be deposited over the insulating layer 208 by any suitable deposition techniques, including but not limited to sputtering deposition processes (i.e., sputtering by PVD deposition processes).

Figure 2C:
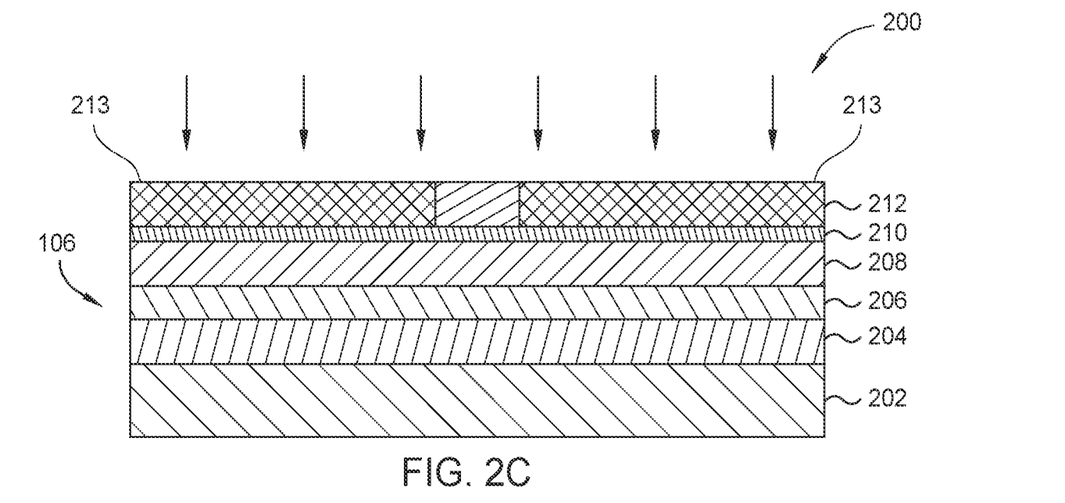
Figure 2D:
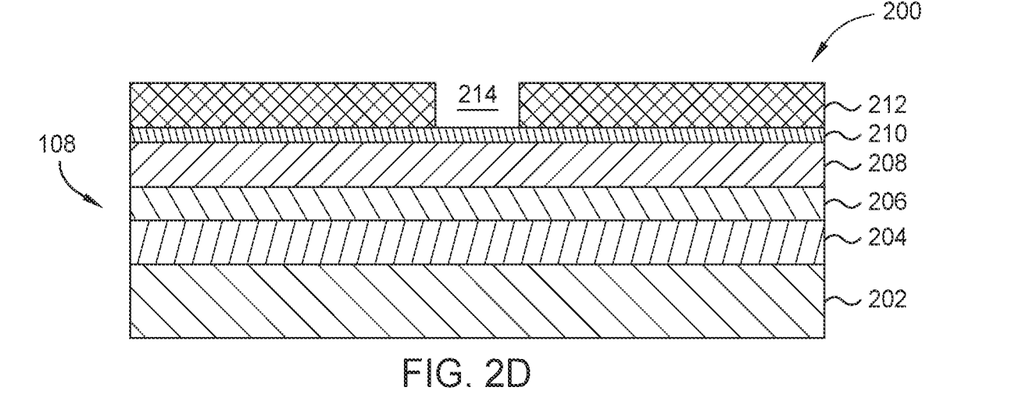

At operation 106 and FIG. 2C, a spin-on/spray-on or dry film resist layer 212, such as a photoresist, is applied, laminated, and patterned over the metal mask layer 210. In certain embodiments, the resist layer 212 is patterned by selective exposure to UV radiation to form one or more patterned regions 213. For example, in certain embodiments, the resist layer 212 is selectively exposed to UV radiation using maskless lithography, such as direct write digital lithography. Upon patterning, the resist layer 212 is developed at operation 108 and FIG. 2D to form one or more trenches 214 therein. As shown in FIG. 2D, in examples where the resist layer 212 is a negative photoresist, the trenches 212 are formed in regions of the resist layer 212 previously left un-patterned at operation 106. In examples where the resist layer 212 is a positive photoresist, the trenches 212 correspond to the patterned regions 213 formed at operation 106. In certain embodiments, the development process is a wet process that includes exposing the resist layer 212 to a solvent. For example, the development process may be a wet etch process utilizing an aqueous etch process. In other examples, the film development process may be a wet etch process utilizing a buffered etch process selective for a desired material. However, any suitable wet solvents or combination of wet etchants may be used for the resist film development process.

As depicted in FIGS. 2C-2D, the resist layer 212 is patterned and developed according to a desired morphology and lateral dimensions of a subsequently formed mico-via. Generally, the mico-via has a cylindrical or round tubular shape corresponding to a morphology of an interconnect to be routed therethrough. Accordingly, in certain embodiments, the resist layer 212 is patterned and developed to form a cylindrical trench 214 therein, enabling the downstream transfer of the cylindrical pattern to the metal mask layer 210 and insulating layer 208. In further embodiments, however, a non-cylindrical or non-annular interconnect and/or via is desired, and thus, a non-cylindrical trench 214 is formed. For example, in certain embodiments, the trench 214 formed in resist layer 212 at operation 108 may be ovate, ellipsoid, or polygonal in shape.

Figure 2E:
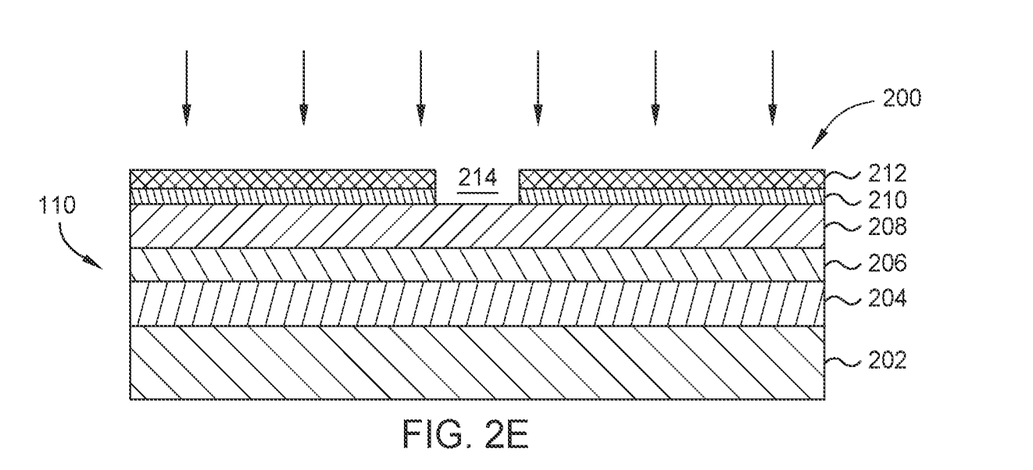

At operation 110 and FIG. 2E, the semiconductor device 200, now having a patterned and developed resist layer 212 formed thereon, is exposed to an etch process to transfer the pattern of the resist layer 212 to the metal mask layer 210. Accordingly, the trench 214 is extended into the metal mask layer 210, thus exposing the insulating layer 208 below. As shown in FIG. 2E, a portion of the resist layer 212 may also be consumed during the process.

In certain embodiments, the etch process is a plasma-based dry etch process performed in an inductively-coupled plasma (ICP) dry etch chamber. For example, in embodiments where the metal mask layer 210 is a chromium mask layer, the semiconductor device 200 may be exposed to a dry chromium-selective etch process. In such embodiments, the dry etch process may utilize oxygen ($O_2$), ammonia ($NH_3$), nitrogen ($N_2$), helium (He), chlorine ($Cl_2$), and/or argon (Ar) reactive gases. For example, in certain embodiments, a reactive gas mixture of 90:5:20 $Cl_2$:$O_2$:Ar is utilized. The chromium-selective etch process may further utilize a plasma-generating power of between about 200 watts (W)

and about 2000 W, such as about 600 W, with a bias power between about 100 W and about 400 W, such as about 220 W, and may be carried out at a pressure of between about 2 milliTorr (mTorr) and about 100 mTorr, such as about 10 mT.

Figure 2F:
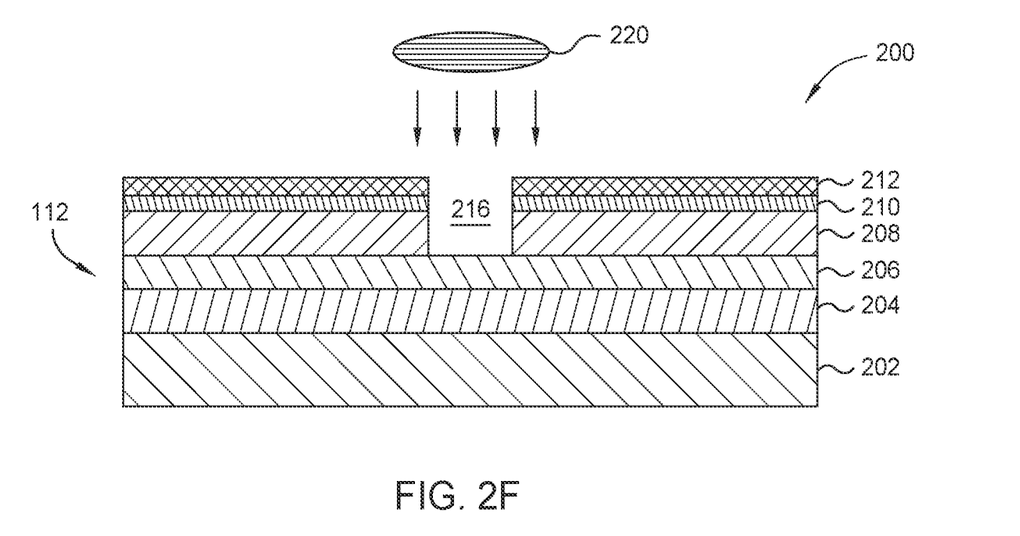

After etching the metal mask layer 210, the semiconductor device 200 is exposed to a laser ablation process at operation 112 and FIG. 2F to ablate the portion of the insulating layer 208 exposed through the metal mask layer 210, thus forming a micro-via 216 therein. The laser ablation process may be performed utilizing any suitable type of laser system with adjustable laser process parameters and characteristics, including but not limited to laser power, focal beam diameter, focus height, pulse energy, pulse width, burst energy, number of pulses per burst train (e.g., sequences of pulses separated by a desired duration of time), pulse frequency, burst frequency, beam spot size, and spatial beam profile (Gaussian or top-hat). Generally, the laser system at operation 112 may generate a laser beam with a spot size larger than the litho-defined hole in the metal mask layer 210, since the metal mask layer 210 will protect portions of the insulating layer 208 disposed thereunder.

In certain embodiments, the laser ablation process at operation 112 is performed utilizing an ultraviolet (UV) laser, such as a femtosecond (fs) UV laser with an Innoslab laser source, emitting a laser beam with a wavelength between about 180 nm and about 400 nm, such as between about 300 nm and about 360 nm, such as about 345 nm or about 355 nm. In such embodiments, the UV laser may ablate the insulating layer 208 by generating a pulsed laser beam, which may be emitted in one or more fixed-frequency, e.g., 50 MHz or more, pulse-burst trains with a pulse energy between about 5 nJ and about 10 nJ. Since metals such as copper are not resistant to UV laser beams, utilization of a pulse-burst mode with a precise energy dosage between about 5-10 nJ may facilitate ablation of the insulation layer 208 with reduced debris formation and little to no damage to the underlying conductive layer 206, as compared to a continuous or continuously-pulsed UV laser beam. Thus, the conductive layer 206 may act as a laser stop during the laser ablation process at operation 112. Furthermore, the UV laser conditions described above, in combination with the pre-patterned metal mask layer 210, enable very precise via shape control, including top/bottom opening size, opening morphology, and taper between top/bottom openings.

In certain embodiments, the laser ablation process at operation 112 is performed utilizing a laser source performing at infrared (IR) wavelengths between about 700 nm and about 1 mm, such as near-infrared (NIR) wavelengths between about 700 nm to about 2.5 µm, or mid-infrared (mid-IR) wavelengths between about 2.5 µm and about 24 µm. For example, in certain embodiments, the laser ablation process at operation 112 is performed using a laser source with a NIR to mid-IR wavelength between about 2 µm and about 3 µm. The 2-3 µm wavelengths are highly selective for polymeric materials relative to metallic materials and thus, allow a higher alignment tolerance between the emitted laser beam and the pre-patterned trench 214 in the metal mask layer 210 since the metal mask layer 210 will simply reflect any misaligned portion of the laser beam. Furthermore, the increased ablation efficiency of the 2-3 µm wavelengths for polymeric materials, such as those of the insulating layer 208, and relatively low ablation efficiency for metals facilitates little to no damage to the underlying conductive layer 206 during operation 112. In certain embodiments, the NIR or mid-IR laser is a fiber laser producing a laser beam via one or more cascaded processes in an optical fiber. For example, in certain embodiments, the fiber laser may inject a nanosecond (ns) or picosecond (ps) seed laser beam, e.g., of wavelength of about 1 µm, into a series of passive or active fibers with extended transmission in the desired IR wavelength range for nonlinear frequency conversion. In certain other embodiments, the fiber laser may pump a short pulse, high intensity, seed laser beam, such as a fs seed laser beam, into a highly nonlinear optical medium with normal dispersion, such as chalcogenide glass fibers. In still other embodiments, the fiber laser may utilize erbium-doped or fluoride fibers, or other doped mid-IR fibers to emit at wavelengths of about 3 µm.

In embodiments where a plurality or array of micro-vias 216 are desired, the laser system may include a scanner 220, such as a single- or multi-axis large angle galvanometer optical scanner (e.g., galvo scanner), to facilitate scanning of one or more laser beams from a laser source across a surface of the semiconductor device 200 to form the plurality or array of micro-vias 216. The term "galvanometer scanner" generally refers to any type of device that may change a projection or reflection angle of one or more laser beams to sweep the laser beam(s) across the semiconductor device 200. For example, the scanner 220 may include one or more adjustable and electromechanically-controlled mirrors to diverge (e.g., multiply) and/or steer the laser beam across the semiconductor device 200 during the laser ablation process at operation 112. In certain embodiments, utilization of the scanner 220 enables drilling of a single micro-via 216 in the semiconductor device 200 at a time, multiple micro-vias 216 simultaneously, or scanning of the laser beam across a surface of the semiconductor device 200 to form a plurality of micro-vias 216 with several sweeps.

Figure 2G:
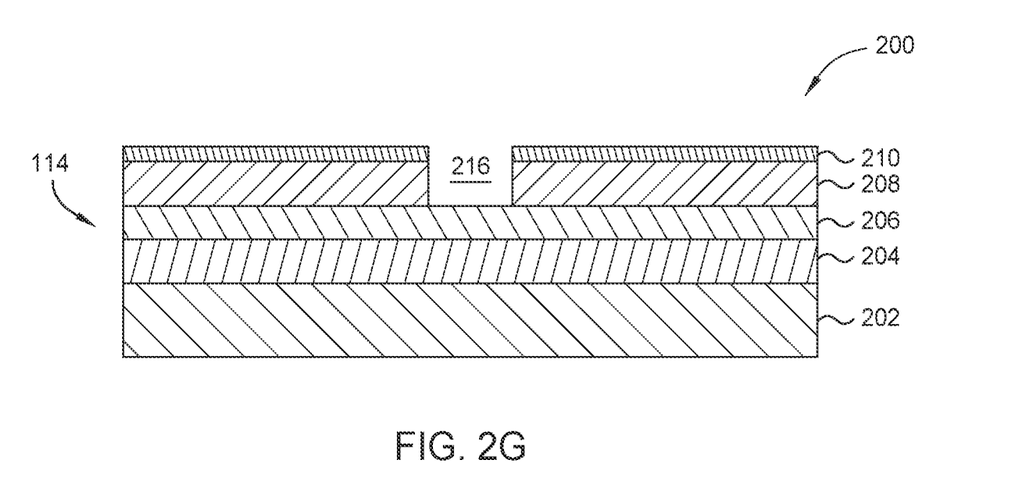

At operation 114 and FIG. 2G, a resist removal process is performed to strip the resist layer 212 from the semiconductor device 200. Operation 114 may be performed before or after the laser ablation process at operation 112. In certain embodiments, the resist layer 212 is removed by one or more dry processes such as dry etching or ashing. In certain embodiments, the resist removal process includes exposing the semiconductor device 200 to a microwave $O_2$ plasma while maintaining the semiconductor device 200 at a temperature between about 60° C. and about 100° C., such as about 80° C., which enables the removal of the resist layer 212 without damaging the conductive layer 206 exposed through micro-via 216. Temperature is a critical factor at operation 114, as utilizing too low of a temperature will drastically decrease the resist strip rate, while utilizing too high of a temperature may cause damage to the underlying conductive layer 206.

Figure 2H:
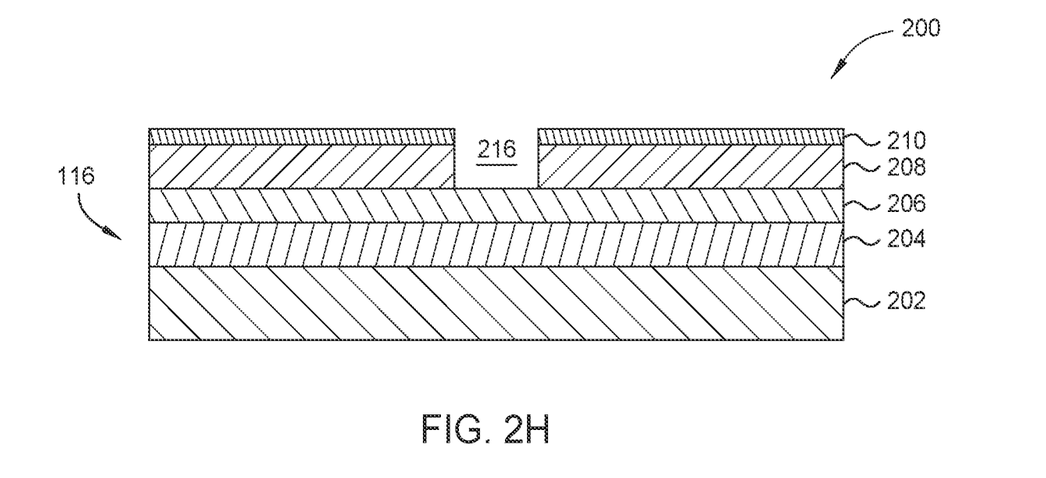

After resist removal, the semiconductor device 200 is exposed to a cleaning process at operation 116 and FIG. 2H to remove any undesired debris remaining in the micro-via 216 from the prior laser ablation process and smoothen surfaces (e.g., walls) of the micro-via 216 exposed to laser drilling. The cleaning process may include any combination of dry and/or wet processes. In certain embodiments, the semiconductor device 200 is exposed to a dry etch process, such as a plasma-based dry etch process. In such embodiments, the plasma-based dry etch process may utilize $O_2$, $CF_4$, $NH_3$, $N_2$, $Cl_2$, and/or Ar reactive gases. For example, in certain embodiments, the plasma-based dry etch process utilizes a reactive gas mixture of 50:3:5 $O_2$:$CF_4$:Ar, a plasma-generating power of between about 200 watts (W) and about 2000 W, such as about 500 W, and a bias power between about 25 W and about 100 W, such as about 50 W. In further embodiments, the semiconductor device 200 is exposed to a wet process, which may be used in combination with one or more dry processes. For example, in certain embodiments, the semiconductor device 200 is exposed to an aqueous solution of 5% methanol:cupric chloride ($CuCl_2$) 3:1, which may be utilized in combination with a plasma-based dry etch process, such as a plasma-based dry etch process utilizing a reactive fluorine gas.

Figure 2I:
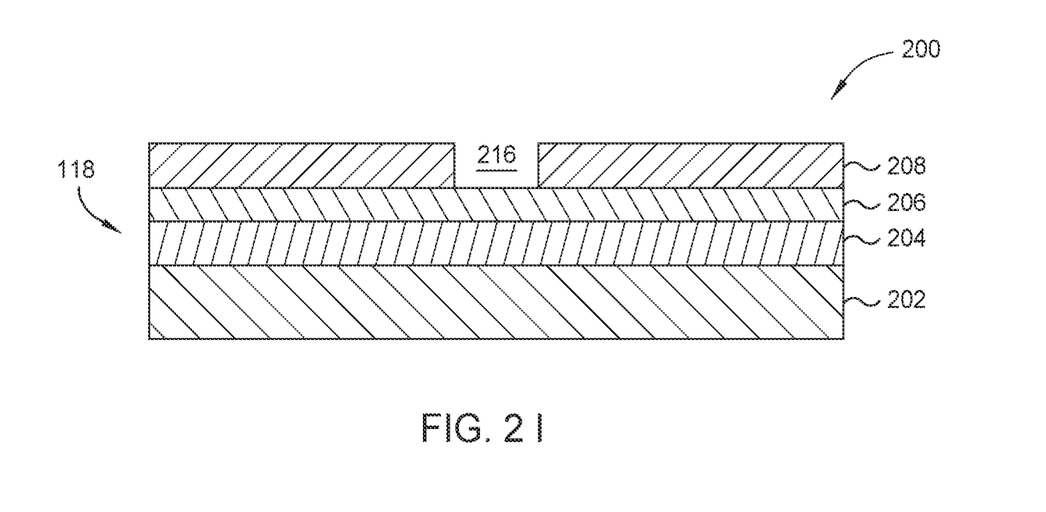

At operation 118 and FIG. 2I, the semiconductor device 200, now cleaned, is selectively etched to remove the metal mask layer 210. Thus, unlike some conventional methods, the metal mask layer 210 does not remain on the semiconductor device 200 during downstream formation of interconnects and therefore, enables the deposition of a seed layer and/or barrier layer directly over the insulating layer 208 prior to interconnect formation. In certain embodiments, the etch process at operation 118 is a wet etch process utilizing any suitable wet etchant or combination of wet etchants in aqueous solution. For example, for embodiments wherein the metal mask layer 210 comprises chromium, the semiconductor device 200 may be immersed in an aqueous etching solution comprising 50% NaOH and 33% $K_3[FE(CN)_6]$ (1:3) at about room temperature (27° C.) for a duration between about 2 to about 10 minutes, such as between about 3 to about 5 minutes.

Figure 2J:
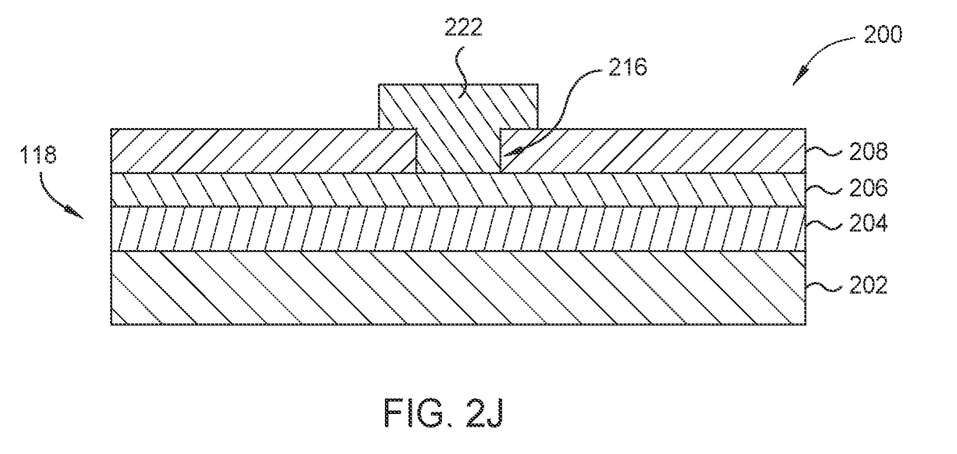

Upon selectively etching the metal mask layer 210, an interconnect 222 may be formed within the micro-via 216, as illustrated in FIG. 2J. The interconnect 222 may be formed over sidewalls of the micro-via 216 that are defined by the insulating layer 208 and extend through the micro-via 216 to the underlying conductive layer 206. The interconnect 222 may be deposited in the micro-via 216 by any suitable methods including electroless deposition or a combination of physical vapor deposition (PVD) and electrochemical deposition (ECD). In certain embodiments, the interconnect 222 is deposited to fill or "plug" the micro-via 216, thus creating a solid or filled conductive body therein. In certain other embodiments, however, the interconnect 222 is deposited to only line surfaces of the micro-via 216.

The interconnect 222 may generally be formed of one or more layers of any suitable conductive material, including but not limited to copper (Cu), aluminum (Al), gold (Au), nickel (Ni), silver (Ag), palladium (Pd), tin (Sn), or the like. In certain embodiments, as described above, an adhesion layer (not shown) and/or a seed layer (not shown) may be formed over the surfaces of the micro-via 216 prior to deposition of the interconnect 222. For example, in certain embodiments, a molybdenum, titanium, tantalum, or titanium-tungsten adhesion layer and/or a copper seed layer are deposited over sidewalls of the micro-via 216 prior to deposition of the interconnect 222 to improve adhesion thereof and block diffusion of conductive materials.

Figure 3A:
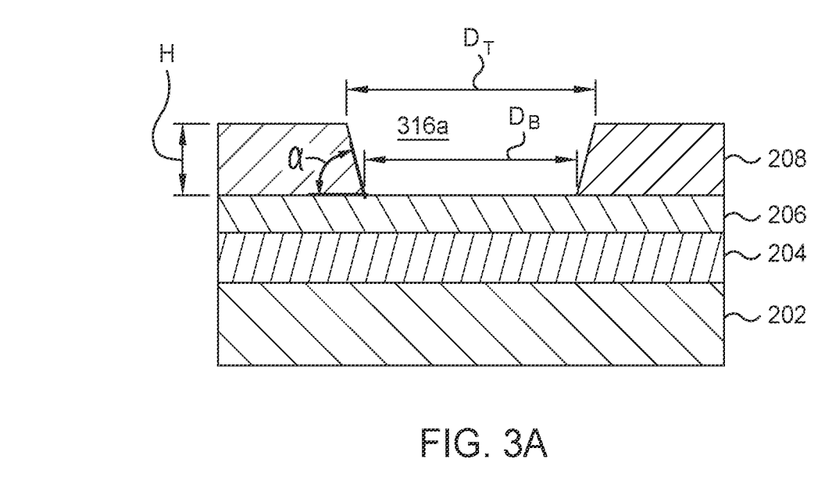
FIGS. 3A-3B schematically illustrate cross-sectional views of micro-vias formed by the process depicted in FIG. 1, according to embodiments described herein.
Figure 3B:
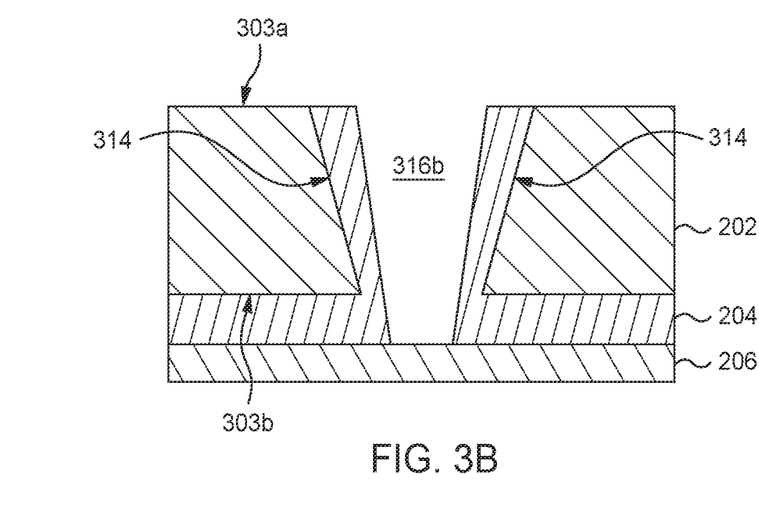

FIGS. 3A and 3B schematically illustrate cross-sectional views of exemplary micro-via structures which can be formed in, e.g., the semiconductor device 200 by the method 100 described above, according to certain embodiments. Note, that only a portion of the semiconductor device 200 is shown in FIGS. 3A-3B.

As shown in FIG. 3A, micro-via 316a is an example of a micro-via formed in a redistribution layer of the semiconductor device 200, which may be a semiconductor package. Accordingly, the micro-via 316a is depicted as being disposed through the insulating layer 208 above the substrate 202, which further includes the insulating layer 204 and the conductive layer 206 formed thereon. Generally, the micro-via 316a is formed through an entire thickness of the insulating layer 208 and therefore, the conductive layer 206 may be used as a laser stop during laser ablation of the micro-via 316a. In certain embodiments, the micro-via 316a has a height between about 2 μm and about 20 μm, which may be equivalent to a thickness of the insulating layer 208. In certain embodiments, the micro-via 316a has substantially vertical sidewalls, and thus, may have a uniform diameter between about 2 μm and about 10 μm, such as a uniform diameter between about 3 μm and about 7 μm. In certain embodiments, a ratio of the micro-via 316a diameter to a thickness of the insulating layer 208 is between about 1:2 and about 1:1.

In certain other embodiments, as shown in FIG. 3A, the micro-via has tapered or angled sidewalls. For example, the sidewalls of the micro-via 316 may have a taper angle α between about 60° and about 90°, such as a taper angle α between about 80° and about 90°. In such embodiments, a top diameter DT of the micro-via 316a is between about 2 μm and about 15 μm, such as between about 4 μm and about 12 μm, and a bottom diameter DB of the micro-via 316a is between about 1 μm and about 8.5 μm, such as between about 2 μm and about 6 μm. Formation of tapered or conical morphologies may be accomplished by, e.g., moving the laser beam of the laser system utilized, e.g., at operation 112, in a spiraling (e.g., circular, corkscrew) motion relative to the central axis of the micro-via 316a. The laser beam may also be angled using a motion system to form the tapered micro-via 316a.

As shown in FIG. 3B, micro-via 316b is an example of a micro-via formed through the substrate 202 of the semiconductor device 200, e.g., extending from a first surface 303a of the substrate 202 to a second surface 303b. In such embodiments, the micro-via 316b is laser-ablated through the insulating layer 204 of the semiconductor device 200, which encapsulates (e.g., surrounds) the substrate 202 and passes through a through-silicon via 314 formed in the substrate 202. Accordingly, in order to form the micro-via 316b, the through-silicon via 314 must first be formed through the substrate 202 by any suitable substrate patterning method(s) prior to the method 100 described above, after which the insulating layer 204 may be laminated over the substrate 202 to adhere thereto and flow into the through-silicon via 314 at operation 100.

In certain embodiments, the through-silicon via 314 is formed via laser ablation, e.g., using an IR, UV, or $CO_2$ laser. For example, the laser utilized to ablate the through-silicon via 314 may be a ps or fs UV laser. In certain examples, the laser is a fs green laser. In still other embodiments, the through-silicon via 314 is formed via a suitable etching process, e.g., a dry etching process, or a bead blasting process. Generally, the through-silicon via 314 may have a cylindrical or tapered morphology, as shown in FIG. 3B. Similar to the micro-via 316a, formation of tapered or conical morphologies may be accomplished by, e.g., moving the laser beam of a laser utilized during substrate patterning in a spiraling (e.g., circular, corkscrew) motion relative to the central axis of the through-silicon via 314. The laser beam may also be angled using a motion system. Similar methods may also be utilized to form a cylindrical through-silicon via 314 having a uniform diameter therethrough.

Upon formation of the through-silicon via 314, insulating layer 204 may be placed over the substrate 202 and laminated, e.g., at operation 102 of the method 100, thus flowing into and filling the through-silicon via 314. In certain embodiments, the lamination process is a vacuum lamination process that may be performed in an autoclave or other suitable device. In certain embodiments, the lamination process is performed by use of a hot pressing process. In certain embodiments, the lamination process is performed at a temperature of between about 80° C. and about 140° C., and for a period between about 5 seconds and about 1.5 minutes. In such embodiments, the lamination process may be performed at a pressure between about 1 psig and about 50 psig. For example, the lamination process may be performed at a pressure between about 5 psig and about 40 psig and a temperature of between about 100° C. and about 120° C. for a period between about 10 seconds and about 1 minute.

After lamination, the micro-via 316b is formed in a portion of the insulating layer 204 extending through the through-silicon via 314, as shown in FIG. 3B, using the method 100. Generally, the micro-via 316b may have a similar lateral shape and/or dimensions to micro-via 316a, e.g., tapered or conical morphology.

Figure 4:
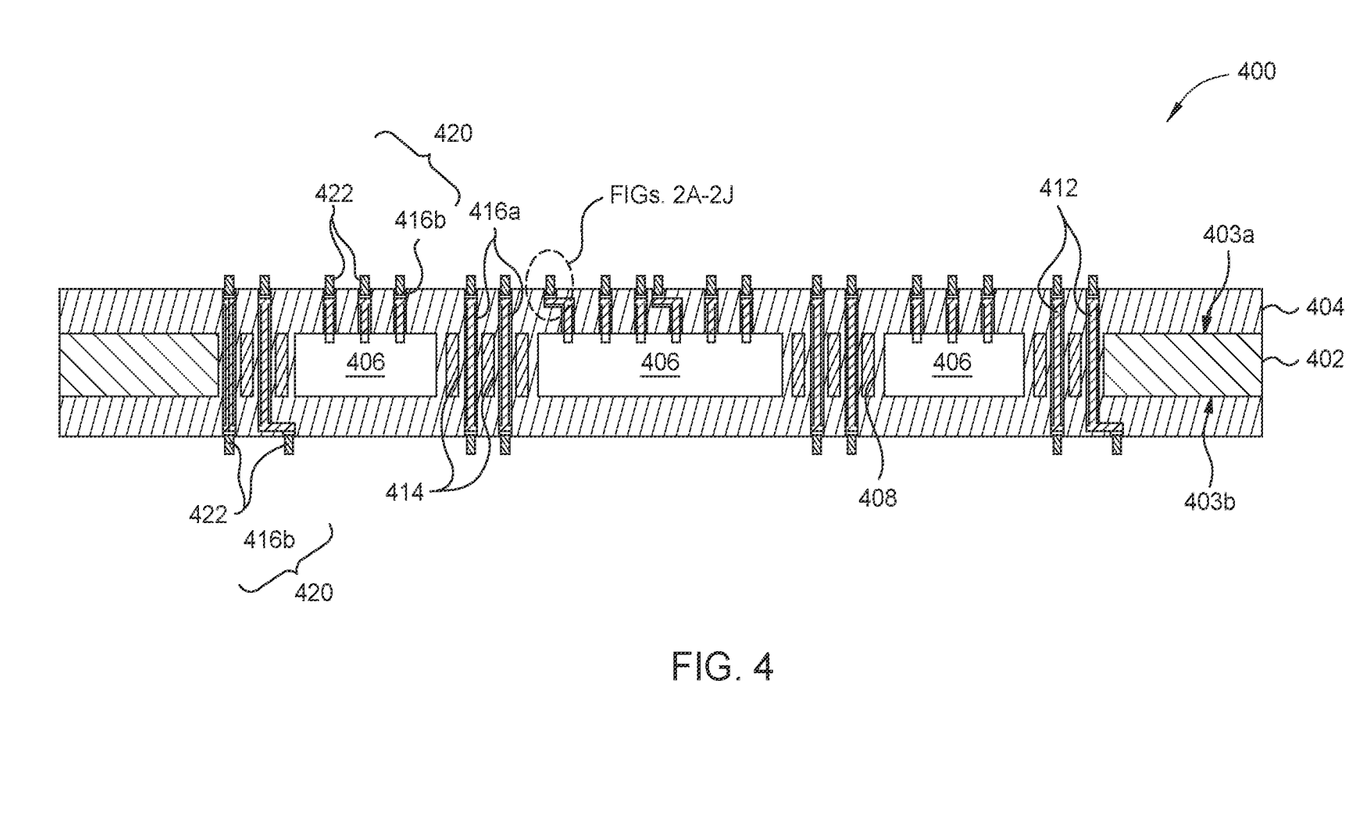
FIG. 4 schematically illustrates a cross-sectional view of an exemplary semiconductor device that includes micro-vias formed by the process depicted in FIG. 1, according to embodiments described herein.

FIG. 4 illustrates a schematic cross-sectional side view of an exemplary semiconductor package 400 having micro-vias formed by the method 100 described above, according to certain embodiments. As shown, the semiconductor package 400 includes a substrate 402, e.g., a silicon substrate, which functions as a package frame and has one or more cavities 408 and one or more through-silicon vias 414 formed therein. An insulating layer 404 is laminated over the substrate 402 and extends through the cavities 408 and the through-silicon vias 414 from a first side 403a of the substrate 402 to a second side 403b. One or more semiconductor dies 406 are disposed in each cavity 408 and are embedded within the insulating layer 404 therein. Similarly, one or more interconnects 412 are disposed in each through-silicon via 414 and are surrounded by the insulating layer 404 therein. On either side of the semiconductor package 400 is a redistribution layer 420, which is comprised of one or more redistribution interconnects 422 in electrical communication with the one or more interconnects 412. The redistribution interconnects 422 may include vertical interconnects and lateral interconnects, such as traces, wires, and pads.

During the formation of the semiconductor package 400, the lamination of the insulating layer 404 causes the dielectric material thereof to flow into and fill the through-silicon vias 414. Therefore, in order to form channels or pathways for the interconnects 412 through the entirety of the substrate 402 after lamination of the insulating layer 404, vias 416a may be laser drilled through the dielectric material of the insulating layer 404 within the through-silicon vias 414, thus forming a via-in-via structure for routing of interconnects 412. Similarly, after formation of the interconnects 412, redistribution interconnects 422 may be formed on either side of the semiconductor package 400 within redistribution vias 416b, which can be laser drilled into the insulating layer 404 as well. Accordingly, the vias 416a and redistribution vias 416b formed in the insulating layer 404 may be micro-vias formed by the methods described above with reference to FIG. 1 and FIGS. 2A-2J above.

In summary, the methods and micro-via structures described above provide many advantages over methods and architectures implementing conventional via fabrication techniques for semiconductor devices. Such benefits include the capability of forming high-quality, low-aspect-ratio micro-via structures that advantageously enable high-density packaging architectures for advanced integrated semiconductor devices with improved performance and flexibility, and relatively low manufacturing costs as compared to conventional packaging technologies.

While the foregoing is directed to embodiments of the present disclosure, other and further embodiments of the disclosure may be devised without departing from the basic scope thereof, and the scope thereof is determined by the claims that follow.

The invention claimed is:

1. A method of forming a micro-via structure in a semiconductor device, comprising:
   laminating a polymeric material layer over a conductive layer on the semiconductor device, wherein the semiconductor device comprises:
   a substrate;
   an insulating layer atop the substrate; and
   the conductive layer atop the insulating layer;
   depositing a metal mask layer over the polymeric material layer;
   applying, patterning, and developing a resist layer over the metal mask layer, wherein developing the resist layer forms a trench in the resist layer corresponding to a desired lateral dimension of the micro-via structure;
   etching the metal mask layer through the trench in the developed resist layer, wherein etching the metal mask layer extends the trench into the metal mask layer and exposes a portion of the polymeric material layer; and
   laser ablating the exposed portion of the polymeric material layer using an ultraviolet (UV) laser in a pulse-burst mode and the pulse burst mode provides pulses at frequency of 50 MHz or more and an energy between 5 nJ and 10 nJ, wherein laser ablating the exposed portion of the polymeric material layer forms the micro-via structure therein having the desired lateral dimension and exposes the conductive layer.

2. The method of claim 1, wherein the polymeric material layer comprises an epoxy resin material having a ceramic filler.

3. The method of claim 1 wherein the metal mask layer comprises chromium (Cr).

4. The method of claim 1, wherein the resist layer is a photoresist and is patterned via selective exposure to UV radiation.

5. The method of claim 1, wherein the resist layer is patterned using direct write digital lithography.

6. The method of claim 1, wherein the metal mask layer is dry-etched using an oxygen-based plasma.

7. The method of claim 1, wherein the polymeric material layer is laser ablated using the UV laser with a wavelength between 345 nm and 355 nm.

8. A method of forming a micro-via structure in a semiconductor device, comprising:
   laminating a polymeric material layer over a conductive layer of the semiconductor device, wherein the semiconductor device comprises:
   a substrate;
   an insulating layer atop the substrate; and
   the conductive layer atop the insulating layer;
   depositing a metal mask layer over the polymeric material layer;
   applying, patterning, and developing a resist layer over the metal mask layer, wherein developing the resist layer forms a trench in the resist layer corresponding to a desired lateral dimension of the micro-via structure;
   selectively etching the metal mask layer through the trench in the developed resist layer, wherein selectively etching the metal mask layer extends the trench into the metal mask layer and exposes a portion of the polymeric material layer;
   laser ablating the exposed portion of the polymeric material layer using an ultraviolet (UV) laser in a pulse-burst mode and the pulse burst mode provides pulses at a frequency of 50 MHz or more and an energy between 5 nJ and 10 nJ, wherein laser ablating the exposed portion of the polymeric material layer forms the micro-via structure therein having the desired lateral dimension and exposes the conductive layer;

exposing the micro-via structure to a cleaning process to remove debris therefrom; and selectively removing the metal mask layer from the polymeric material layer.

9. The method of claim 8, wherein the metal mask layer comprises chromium (Cr).

10. The method of claim 8, wherein the resist layer is patterned using direct write digital lithography.

11. The method of claim 8, wherein the metal mask layer is selectively dry-etched using an oxygen-based plasma.

12. The method of claim 8, wherein the micro-via structure has a lateral dimension between about 2 µm and about 10 µm.

13. The method of claim 8, wherein the micro-via structure has a first lateral dimension between about 2 µm and about 15 µm, and a second later dimension between about 1 µm and about 8.5 µm.

14. A method of forming a micro-via structure in a semiconductor device, comprising:

laminating a polymeric material layer over a conductive layer of the semiconductor device, wherein the semiconductor device comprises:
 a substrate;
 an insulating layer atop the substrate; and
 the conductive layer atop the insulating layer;

depositing a chromium mask layer over the polymeric material layer;

applying, patterning, and developing a resist layer over the chromium mask layer, wherein developing the resist layer forms a trench in the resist layer corresponding to a desired lateral dimension of the micro-via structure;

selectively etching the chromium mask layer through the trench in the developed resist layer, wherein selectively etching the chromium mask layer extends the trench into the chromium mask layer and exposes a portion of the polymeric material layer;

laser ablating the exposed portion of the polymeric material layer using an ultraviolet (UV) laser in a pulse-burst mode and wherein the pulse burst mode provides pulses at frequency of 50 MHz or more and an energy between 5 nJ and 10 nJ, wherein laser ablating the exposed portion of the polymeric material layer forms the micro-via structure therein having the desired lateral dimension, and wherein the conductive layer of the semiconductor device is utilized as a laser stop;

removing the resist layer from the chromium mask layer;

exposing the micro-via structure to a cleaning process to remove debris therefrom, wherein the cleaning process includes a dry fluorine-based plasma etch and a methanol-based wet clean; and selectively removing the chromium mask layer from the polymeric material layer with a wet etch process.

* * * * *